United States Patent
Shah

(10) Patent No.: US 7,519,339 B2
(45) Date of Patent: Apr. 14, 2009

(54) TUNER DESIGN AND SYSTEM FOR LOSSLESS INTERCONNECT OF MULTIPLE TUNERS

(75) Inventor: Peter Jivan Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 551 days.

(21) Appl. No.: 11/298,147

(22) Filed: Dec. 9, 2005

(65) Prior Publication Data
US 2006/0128328 A1 Jun. 15, 2006

Related U.S. Application Data

(60) Provisional application No. 60/636,305, filed on Dec. 15, 2004.

(51) Int. Cl.
*H04B 1/18* (2006.01)
(52) U.S. Cl. .................. 455/130; 455/178.1; 455/187.1; 455/191.1; 348/731
(58) Field of Classification Search ............. 455/178.1, 455/187.1, 191.1, 290; 348/731
See application file for complete search history.

(56) References Cited

U.S. PATENT DOCUMENTS

| | | | |
|---|---|---|---|
| 4,885,557 A | 12/1989 | Barczys et al. | |
| 6,614,299 B2 * | 9/2003 | Hirvilampi et al. | 330/124 R |
| 6,657,491 B2 * | 12/2003 | Fanous et al. | 330/124 R |
| 7,304,689 B2 * | 12/2007 | Englmeier | 348/731 |
| 7,369,827 B1 * | 5/2008 | Koch et al. | 455/191.1 |
| 2003/0128302 A1 | 7/2003 | Potrebic et al. | |

FOREIGN PATENT DOCUMENTS

| | | |
|---|---|---|
| EP | 0496422 | 7/1992 |
| EP | 1365512 | 11/2003 |

* cited by examiner

*Primary Examiner*—Simon D Nguyen
(74) *Attorney, Agent, or Firm*—Michael W. Landry; Bruce W. Greenhaus

(57) ABSTRACT

Tuners with high input impedance are connected to a common radio frequency (RF) signal source. A termination load external to the tuners provides matched impedance loading for the transmission line or cable driving the tuners. Alternatively, the termination load can be located inside one tuner with a switch to enable or disable the load. All tuners receive the same signal and no signal degradation is caused when connecting multiple tuners. The multiple tuner connection is useful in television signal receiving devices that receive more than one independent channel, such as digital video recorders or picture-in-picture television receivers.

16 Claims, 3 Drawing Sheets

TUNER DESIGN AND SYSTEM FOR LOSSLESS INTERCONNECT OF MULTIPLE TUNERS

RELATED APPLICATIONS

This application claims priority from U.S. provisional application No. 60/636,305 filed Dec. 15, 2004 entitled "Tuner Design and System For Lossless Interconnect Of Multiple Tuners", incorporated herein by reference.

BACKGROUND

1. Field of the Invention

The present invention relates to radio frequency signal tuners, and specifically to configurations with multiple tuners connected to one signal source.

2. Prior Art

It is often desired to have two or more tuners receive different, or occasionally identical, signal channels from the same input source simultaneously. This situation arises, for example, in picture-in-picture applications. Another example is a watch-and-record set-top box where one tuner is used for receiving the channel for the TV whereas the other tuner is receiving a channel that is being recorded. The signal source to the multiple tuners can be taken directly from a coaxial cable connector or alternatively from an amplified or filtered signal inside a set-top box.

In prior art, the radio frequency (RF) input signal is usually distributed to the tuners through a daisy-chain, as shown in FIG. 1. This has benefits when using traditional can tuners. These tuners tend to be physically large and the interconnect between them can have significant physical and electrical length. For this reason, the interconnect is usually done with transmission lines or coaxial cables to avoid reflections and other undesirable loading effects. However, this interconnection requires that the loop-through outputs as well as the RF inputs must be controlled impedances that match to the transmission line characteristic impedance, for example 75 Ohms.

In this type of system, the loop-through output can be derived from the RF input by using an RF splitter. This is highly linear but entails loss in both the tuner input signal as well as the loop-through output. Consequently, the signal-to-noise ratio will be degraded for both. Alternatively, an active splitter using an amplifier can be used, which reduces the signal-to-noise degradation but introduces distortion. The end result is that the signal quality is degraded through each stage of the daisy chain.

U.S. Patent Application Publication, US 2003/0035070 A1 published Feb. 20, 2003 to Fanous, et al, entitled "Method and System for Multiple Tuner Application Using a Low Noise Broadband Distribution Amplifier", incorporated herein by reference, discloses a system for multiple tuners using an active splitter, which degrades the signal passed to the tuners.

U.S. Patent Application Publication, US 2005/0253663 A1 published Nov. 17, 2005 to Gomez, et al, entitled "Multi-tuner Receivers with Cross Talk Reduction", incorporated herein by reference, discloses multi-tuner receivers with cross talk reduction that uses an amplifier and alternatively a passive splitter, which degrades the signal passed to the tuners.

U.S. Patent Application Publication, US 2005/0195335 A1 published Sep. 8, 2005 to Gomez, et al, entitled "Multi-input Multi-output Tuner Front Ends", incorporated herein by reference, discloses a front-end circuit for a multiple tuner television receiver that uses adjustable gain amplifiers and separates the signal into a multi-band signal. A multiplexer and switch directs bands to individual tuners. Each of these circuit elements degrades the signal passed to the tuners.

The aforementioned patent application publications illustrate the prior art approach of using amplifiers or a splitter to distribute the RF signal to multiple tuners.

U.S. Pat. No. 6,897,904 issued May 24, 2005 to Potrebic et al., entitled "Method and apparatus for selecting among multiple tuners", incorporated herein by reference, discloses a multiple tuner receiver for a broadcast signal. This disclosure concerns the selection among tuners, each receiving a common signal, but does not address how to couple the signal to multiple tuners with minimal signal degradation. The disclosure simply shows two tuners connected to the same source without addressing impedance matching or signal degradation.

The prior art tuner interconnection causes signal quality degradation when multiple tuners receive the same signal, even when the tuners are selecting different channels from the same source.

SUMMARY OF THE INVENTION

The present invention overcomes the signal degradation of the prior art daisy-chain and signal splitting approaches to multiple tuner interconnect by providing high input impedance tuners that can be connected in parallel to the same signal source. A termination load external to the tuners provides matched impedance loading for the transmission line or cable driving the tuners. Alternatively, the termination load can be located inside one tuner with a switch to enable or disable the load, or the termination can be an inherent part of the tuner itself and thus not cause additional loss or higher noise figure. All tuners receive the same signal and no signal degradation is caused when connecting multiple tuners.

DETAILED DESCRIPTION OF THE INVENTION

Figure 1:
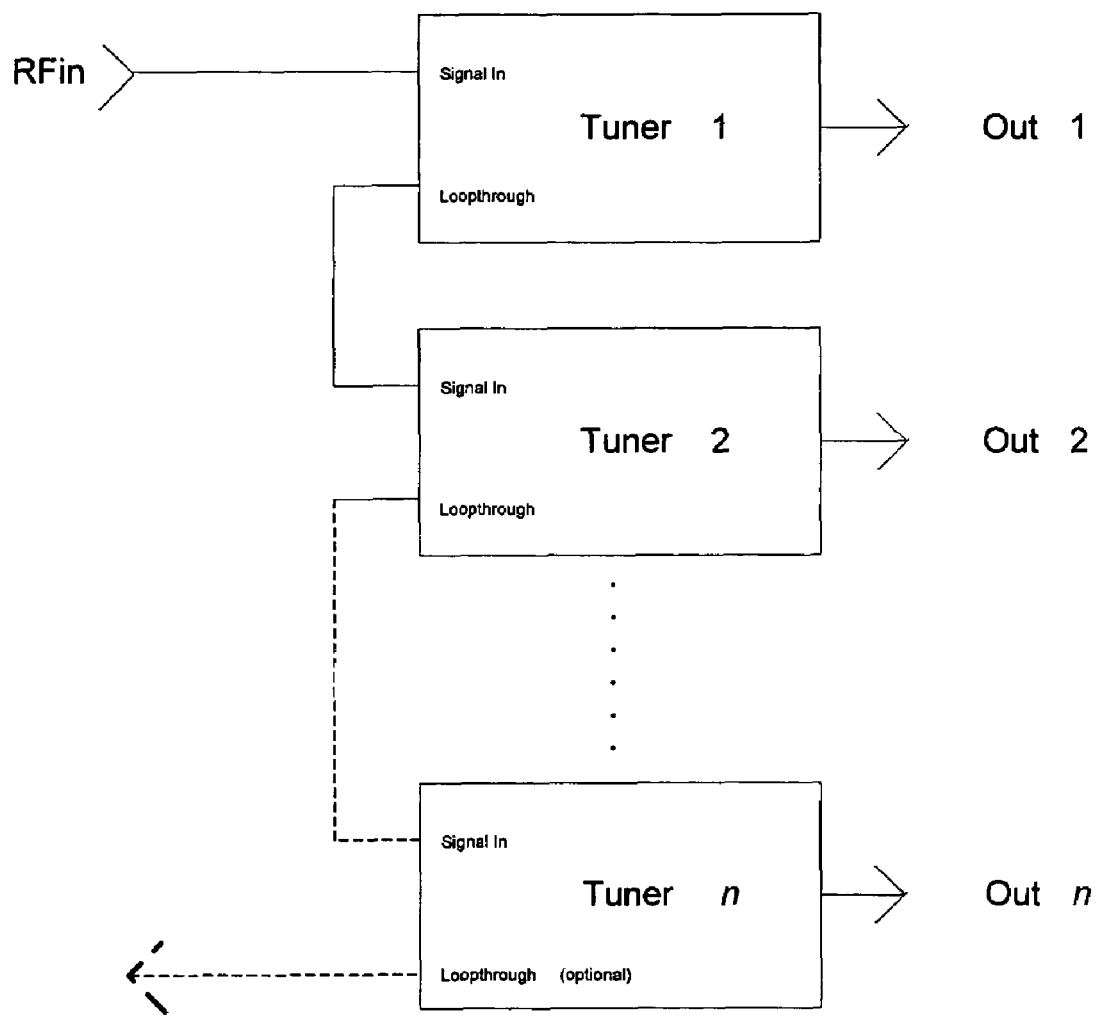
FIG. 1 shows the prior art where the radio frequency (RF) input signal is distributed to multiple tuners through a daisy-chain configuration.
Figure 2:
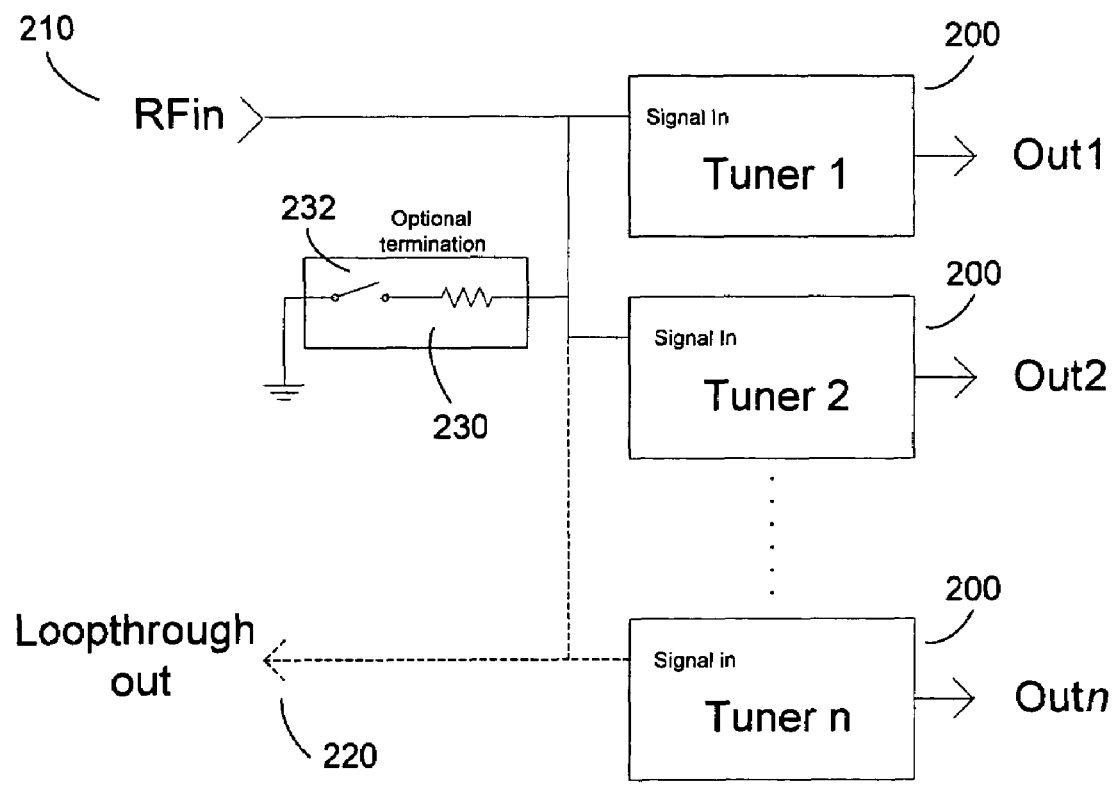
FIG. 2 shows multiple interconnected tuners connected to a source according to the present invention.

FIG. 2 shows multiple interconnected tuners 200 connected to a source through input 210 according to the present invention. The loop-through out terminal 220 and the termination block 230 are optional and illustrate various aspects of the invention. The tuners are designed to have high natural input impedance at "signal in" and thus do not provide impedance matching at the RF input. A separate matching impedance, also called terminating impedance, is used that provides the proper matching to the transmission line driving the tuners when combined with the input impedance of the tuners. Common transmission line impedance is 75 Ohms used with coaxial cable; however, other characteristic impedances can be used.

In some systems, it may be a requirement that the RFin terminal 210 be a controlled impedance. This can be achieved by adding a termination impedance 230 as shown in FIG. 2, which can be a simple resistor, a matching network comprising inductors, capacitors, and/or resistors, or an active termination. An active termination can be implemented in several known ways. One method is to place a resistor in the feedback of an inverting amplifier. Due to the Miller effect, the input impedance will be a fraction of the feedback resistance and can be made equal to the desired terminating impedance. This allows using a resistor whose value is larger than the desired terminating impedance and therefore its current noise will be lower, resulting in overall lowered noise. Alternatively, one or more of the tuners can be designed with input impedances chosen such that the parallel combination of them provides the desired input impedance at the RFin terminal 210.

FIG. 2 also shows a method for implementing a loop-through function without signal quality degradation. In this case, the required input impedance at the RFin input 210 is simply provided by the next system that is connected to the loop-through output 220. In practical use, it may not be predictable whether another system will be connected to the loop-through output 220. In that case, a termination block has an added switch 232. The switch can be controlled depending on whether the loop-through output 220 is connected or not. In its simplest form, the switch control can be mechanical, detecting when a cable is connected to the loop-through connector. The termination block 230 and switch function 232 does not necessarily have to be a stand-alone function; it could equally well be an integral part of one or more of the tuners.

The interconnect method is suitable if the distance between the tuners is small. This can be the case if the tuners reside in the same module or are in close proximity. The method is especially beneficial for so-called "silicon tuners", that is, tuners where a large part of the tuner function is integrated onto an integrated circuit where these circuits can easily be placed in close proximity to each other. The method is even more advantageous where more than one tuner function is integrated on the same die or in the same package. Here the distance between tuner inputs is naturally very small. Additionally, tuners can be interconnected over larger distances with a terminated transmission line if the stub created by each tuner tapping the line produces minimal reflection.

Figure 3:
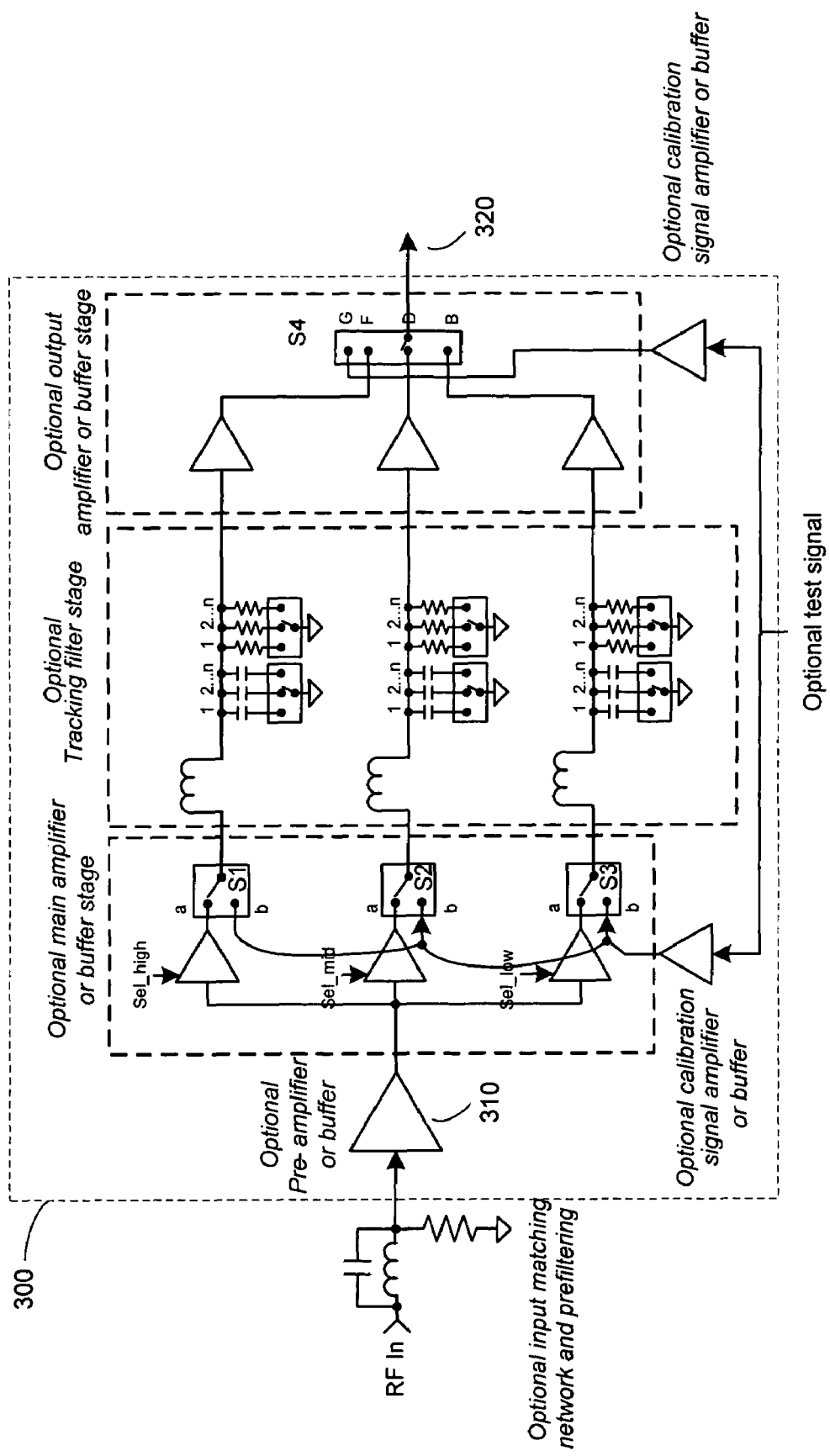
FIG. 3 shows an example embodiment of a tuner front-end for use with the present invention.

FIG. 3 shows an example embodiment of a tuner front-end 300 for use with the present invention. The tuner front-end output 320 connects to other signal processing circuitry in tuner 200. Because of the high input impedance, several tuners can be connected to the RFin line without loading it down unacceptably. Preamplifier or main amplifier 310 can be any well-known amplifier type that provides a high input impedance to the tuner input. Each tuner input impedance preferably is greater than N times the desired matching impedance, where N is the number of tuners connected to the source. In one embodiment, each tuner input impedance is equal to N times the source impedance so that the input match is provided in that way. Tuner input impedance can range from 100 Ohms to several kilo-Ohms or higher, limited by device technology used for the amplifiers receiving the signal in the tuner and signal noise considerations common for RF circuit design. In another embodiment, the tuner input impedances can be unequal while the parallel combination provides a desired impedance level. The impedance created by the parallel combination of tuners can be a matched impedance or an intentional mismatched impedance.

The circuitry shown in FIG. 3 is representative of signal processing functions of a typical tuner and are not necessary for the operation of the tuner interconnect approach of the present invention.

Finally it should be clear that the interconnect method is applicable to any type of receiver system, not only cable or TV tuners.

What is claimed is:

1. A method of interconnecting a plurality of radio frequency tuners comprising the steps of:
providing a high input impedance at each tuner input;
connecting together each tuner input with a signal conductor;
connecting a terminating impedance to the conductor that provides a predetermined impedance value when considered in combination with the high input impedance of the tuners;
connecting a switch in series with the terminating impedance; and
controlling the switch to selectively connect the terminating impedance.

2. The method of claim 1 further comprising the step of integrating the switch in at least one tuner.

3. The method of claim 1 further comprising the step of integrating the terminating impedance in at least one tuner.

4. The method of claim 1 further comprising the step of integrating the switch and the terminating impedance in at least one tuner.

5. A tuner for use with parallel connection of multiple tuners to a signal source comprising:
a signal input terminal;
a high impedance input circuit connected to the signal input terminal that receives the signal;
a matching impedance and switch connected in series and connected to the input terminal, wherein the switch is controlled to selectively connect the matching impedance to the input terminal;
whereby a plurality of tuners can be connected to the signal source and present a matched impedance loading of the signal source.

6. The tuner of claim 5 wherein the input circuit is an amplifier.

7. The tuner of claim 5 wherein the input circuit is a filter.

8. A system for receiving and processing a radio frequency signal comprising:
a plurality of tuners each with a high input impedance;
a matching impedance;
a connection wherein the inputs of each tuner is connected together and connected to the matching impedance and
a switch connected in series with the matching impedance, the switch controllable to selectively connect the matching impedance.

9. The system of claim 8 further comprising a filter connected to at least one tuner input.

10. The system of claim 8 wherein the matching impedance is integrated into at least one tuner.

11. The system of claim 10 wherein at least two tuners are integrated into a single integrated circuit.

12. The system of claim 8 wherein at least two tuners are integrated into a single integrated circuit.

13. A system for receiving and processing a radio frequency signal comprising:
a plurality of tuners each with an input impedance;
a connection wherein the inputs of each tuner is connected together and;
a switch connected in series with a terminating impedance, the switch controllable to selectively connect the terminating impedance;
wherein the input impedance of each tuner is a predetermined value wherein the parallel combination of the tuner input impedances provides a matched termination.

14. The system of claim 13 wherein the input impedance is determined by the terminating impedance.

15. The system of claim 14 wherein at least two tuners are integrated into a single integrated circuit.

16. The system of claim 13 wherein at least two tuners are integrated into a single integrated circuit.

* * * * *